(12) United States Patent
Lang et al.

(10) Patent No.: US 9,059,667 B2
(45) Date of Patent: Jun. 16, 2015

(54) CLASS D AUDIO AMPLIFIER WITH NOISE SUPPRESSION AND THE METHOD THEREOF

(71) Applicant: Chengdu Monolithic Power Systems Co., Ltd., Chengdu (CN)

(72) Inventors: Yunping Lang, Hangzhou (CN); Li Lian, Chengdu (CN)

(73) Assignee: Chengdu Monolithic Power Systems Co., Ltd., Chengdu (CN)

( * ) Notice: Subject to any disclaimer, the term of this patent is extended or adjusted under 35 U.S.C. 154(b) by 127 days.

(21) Appl. No.: 13/857,433

(22) Filed: Apr. 5, 2013

(65) Prior Publication Data
US 2013/0271215 A1 Oct. 17, 2013

(30) Foreign Application Priority Data
Apr. 13, 2012 (CN) .......................... 2012 1 0107589

(51) Int. Cl.
*H03F 1/14* (2006.01)
*H03F 3/217* (2006.01)

(52) U.S. Cl.
CPC ................ *H03F 3/2171* (2013.01); *H03F 1/14* (2013.01)

(58) Field of Classification Search
CPC .................................. H03F 1/14; H03G 3/348
USPC ................................ 330/51, 207 A; 381/94.5
See application file for complete search history.

(56) References Cited

U.S. PATENT DOCUMENTS 8,022,682 B2 * 9/2011 Honda et al. .................. 323/284

\* cited by examiner

*Primary Examiner* — Steven J Mottola
(74) *Attorney, Agent, or Firm* — Perkins Coie LLP

(57) ABSTRACT

A class D audio amplifier having: an audio control circuit configured to provide a switching signal based on an input signal and a reference signal; an input capacitor coupled between the input signal and the first input terminal of the audio control circuit; an inductor having a first terminal coupled to the switching terminal of the audio control circuit, and a second terminal; an output capacitor having a first terminal coupled to second terminal of the inductor and a second terminal coupled to a load; and a noise suppression circuit having a first terminal coupled to the first input terminal of the audio control circuit, and a second terminal coupled to the switching terminal of the audio control circuit, wherein the noise suppression circuit charges the input capacitor and the output capacitor to reach a preset value.

14 Claims, 8 Drawing Sheets

CLASS D AUDIO AMPLIFIER WITH NOISE SUPPRESSION AND THE METHOD THEREOF

CROSS-REFERENCE TO RELATED APPLICATION(S)

This application claims priority to and the benefit of Chinese Patent Application No. 201210107589.6, filed Apr. 13, 2012, which is incorporated herein by reference in its entirety.

TECHNICAL FIELD

The present invention relates generally to electrical circuits, and more particularly but not exclusively to class D audio amplifier with noise suppression and the method thereof.

BACKGROUND

Most of conventional class D audio amplifiers suffer from the transient noise, such as "pop" or "click". The noise is usually caused by charging or discharging an input capacitor, an output capacitor or a bootstrap capacitor of the class D audio amplifier. FIG. 1 schematically shows a prior art class D audio amplifier. In FIG. 1, an input signal Vinput is provided to an input terminal NIN of an audio control circuit via an input capacitor Cin and an input resistor Rin. A voltage reference of 0.5 VDD is provided to another input terminal PIN of the audio control circuit, wherein VDD is the power supply voltage of the class D audio amplifier. An integrating capacitor $C_{INT}$ is coupled between the two input terminals of the audio control circuit. An output signal of the class D audio amplifier is provided to a speaker via a low pass filter comprising an inductor Lf and a capacitor Cf. In FIG. 1, Cout represents the output capacitor and Cbs represents the bootstrap capacitor.

In FIG. 1, when the system starts up, the input capacitor Cin and the output capacitor Cout need to be charged to half of the power supply voltage in order to prevent output signal being clipped in both positive and negative side. That means Vsw=VNIN=VPIN=0.5 VDD. FIG. 2A shows the waveform of the current Ispeaker flowing through the speaker when the input capacitor Cin and the output capacitor Cout are charged. The pulse of the current Ispeaker is caused by a step of the charging current of the output capacitor Cout. Inevitably, the pulse of the current Ispeaker includes some components which are audible to humans, i.e., the frequency of some current components are within the range of 20 Hz-20 kHz, and will bring in noise in the speaker.

In FIG. 1, the charging current paths of the input capacitor Cin, the output capacitor Cout and the bootstrap capacitor Cbs are indicated by broken lines with arrows. As can be seen from FIG. 1, because of the resistor Rf, a voltage across the output capacitor Cout will be larger than 0.5 VDD when the voltage VNIN at the input terminal NIN reaches 0.5 VDD. Then, the output capacitor Cout will be discharged during the normal operation of the class D audio amplifier. The discharging current causes "pop" or "click" noise in the speaker. FIG. 2B shows the waveform of the current Ispeaker and the voltage Vspeaker of the speaker during the normal operation of the circuit in FIG. 1. As can be seen from FIG. 2B, there are fluctuations in the current Ispeaker and the voltage Vspeaker in interval t0-t1 during when the output capacitor Cout is discharged. The fluctuations in the current Ispeaker and the voltage Vspeaker cause noise.

The present invention pertains to provide a class D audio amplifier with noise suppression.

SUMMARY

It is an object of the present invention to provide a class D audio amplifier with noise suppression to solve the above problems.

In accomplishing the above and other objects, there has been provided, in accordance with an embodiment of the present invention, a class D audio amplifier comprises: an audio control circuit having a first input terminal configured to receive an input signal, a second input terminal configured to receive a reference signal, and a switching terminal configured to provide a switching signal based on the input signal and the reference signal; an input capacitor coupled between the input signal and the first input terminal of the audio control circuit; an inductor having a first terminal and a second terminal, the first terminal coupled to the switching terminal of the audio control circuit; an output capacitor having a first terminal coupled to the second terminal of the inductor, and a second terminal coupled to a load; and a noise suppression circuit having a first terminal coupled to the first input terminal of the audio control circuit, and a second terminal coupled to the switching terminal of the audio control circuit, wherein the noise suppression circuit charges the input capacitor and the output capacitor to reach a preset value.

Furthermore, there has been provided, in accordance with an embodiment of the present invention, a method of noise suppression in a class D audio amplifier, wherein the class D audio amplifier may comprise an input capacitor, an output capacitor, a bootstrap capacitor and an audio control circuit having a first input terminal, a second input terminal and a switching terminal, comprising: providing current to the bootstrap capacitor by a first current source before the audio amplifier is enabled; providing current to the input capacitor and the output capacitor by a second current source once the audio amplifier is enabled, wherein the frequency of the current provided by the second current source is sub threshold for human audition; providing current to the input capacitor by a third current source after the audio amplifier is enabled; stopping the second current source from providing current to the input capacitor and to the output capacitor when the voltage at the switching terminal reaches a preset value; stopping the third current source from providing current to the input capacitor when the voltage at the first input terminal of the audio control circuit reaches the preset value; and starting normal operation of the class D audio amplifier when the voltage at the first input terminal of the audio control circuit reaches the preset value.

These and other features of the present invention will be readily apparent to persons of ordinary skill in the art upon reading the entirety of this invention, which includes the accompanying drawings and claims.

The use of the same reference label in different drawings indicates same or like components.

DETAILED DESCRIPTION

In the present invention, numerous specific details are provided, such as examples of circuits, components, and methods, to provide a thorough understanding of embodiments of the invention. Persons of ordinary skill in the art will recognize, however, that the invention can be practiced without one or more of the specific details, and could be adopted in many applications besides the phase-shift dimming circuits, for example, the invention could also be applied in interleaving circuits. In other instances, well-known details are not shown or described to avoid obscuring aspects of the invention.

Figure 1:
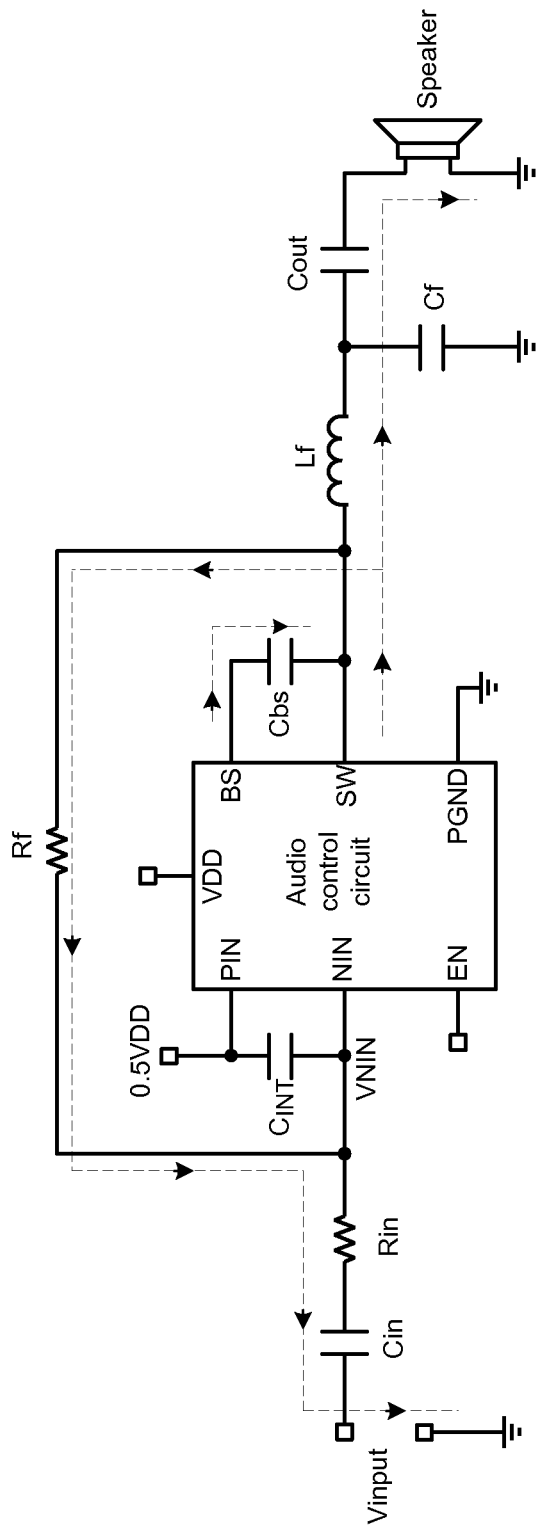
FIG. 1 schematically shows a prior art class D audio amplifier.
Figure 2A:
FIG. 2A shows the waveform of the current Ispeaker flowing through the speaker when the input capacitor Cin and the output capacitor Cout are charged.
Figure 2B:
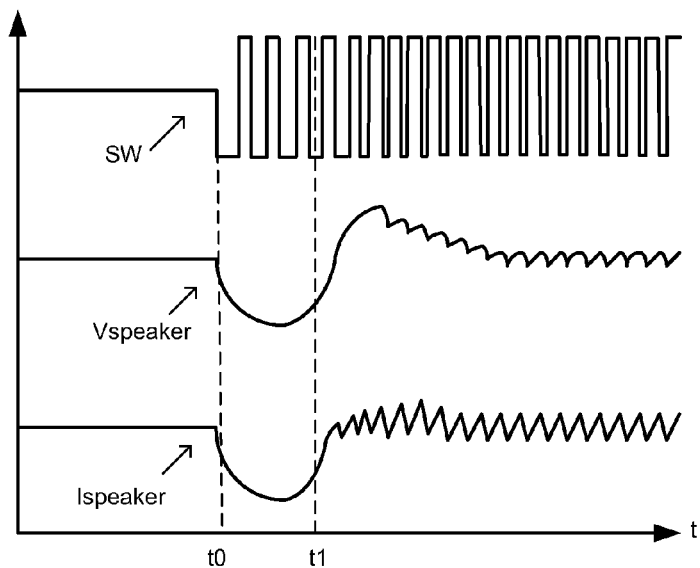
FIG. 2B shows the waveform of the current Ispeaker and the voltage Vspeaker of the speaker during the normal operation of the circuit in FIG. 1.
Figure 3:
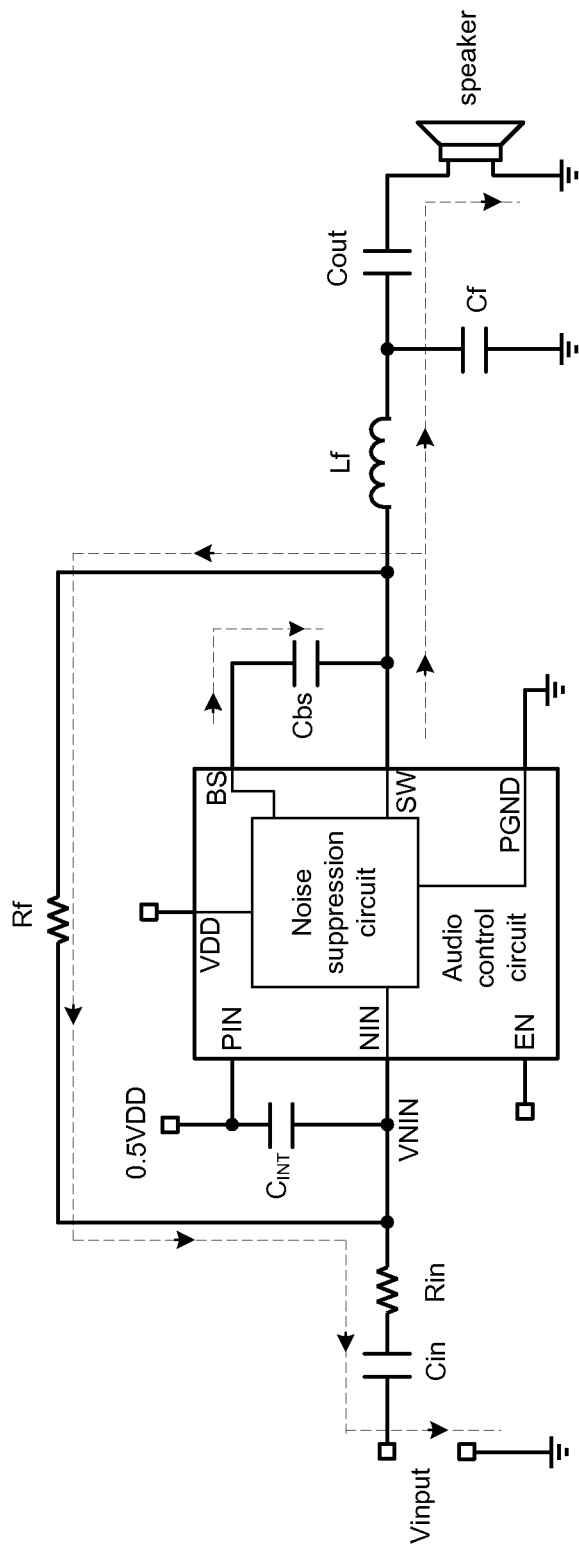
FIG. 3 schematically shows a class D audio amplifier with a noise suppression circuit in accordance with an embodiment of the present invention.

FIG. 3 schematically shows a class D audio amplifier with a noise suppression circuit in accordance with an embodiment of the present invention. In the example of FIG. 3, the noise suppression circuit is integrated in an audio control circuit. Persons of ordinary skill in the art should know that the noise suppression circuit may be integrated in a single chip. As shown in FIG. 3, the class D audio amplifier comprises the audio control circuit, an input capacitor Cin, an output capacitor Cout and an inductor Lf. The audio control circuit having a first input terminal NIN configured to receive an input signal Vinput, a second input terminal PIN configured to receive a reference signal and a switching terminal SW coupled to a first terminal of the inductor Lf. The input capacitor Cin is coupled between the input signal Vinput and the first input terminal NIN. The reference signal has a value of half of a power supply voltage VDD. The output capacitor Cout is coupled between a second terminal of the inductor Lf and a speaker, wherein the speaker is configured as a load.

Figure 4A:
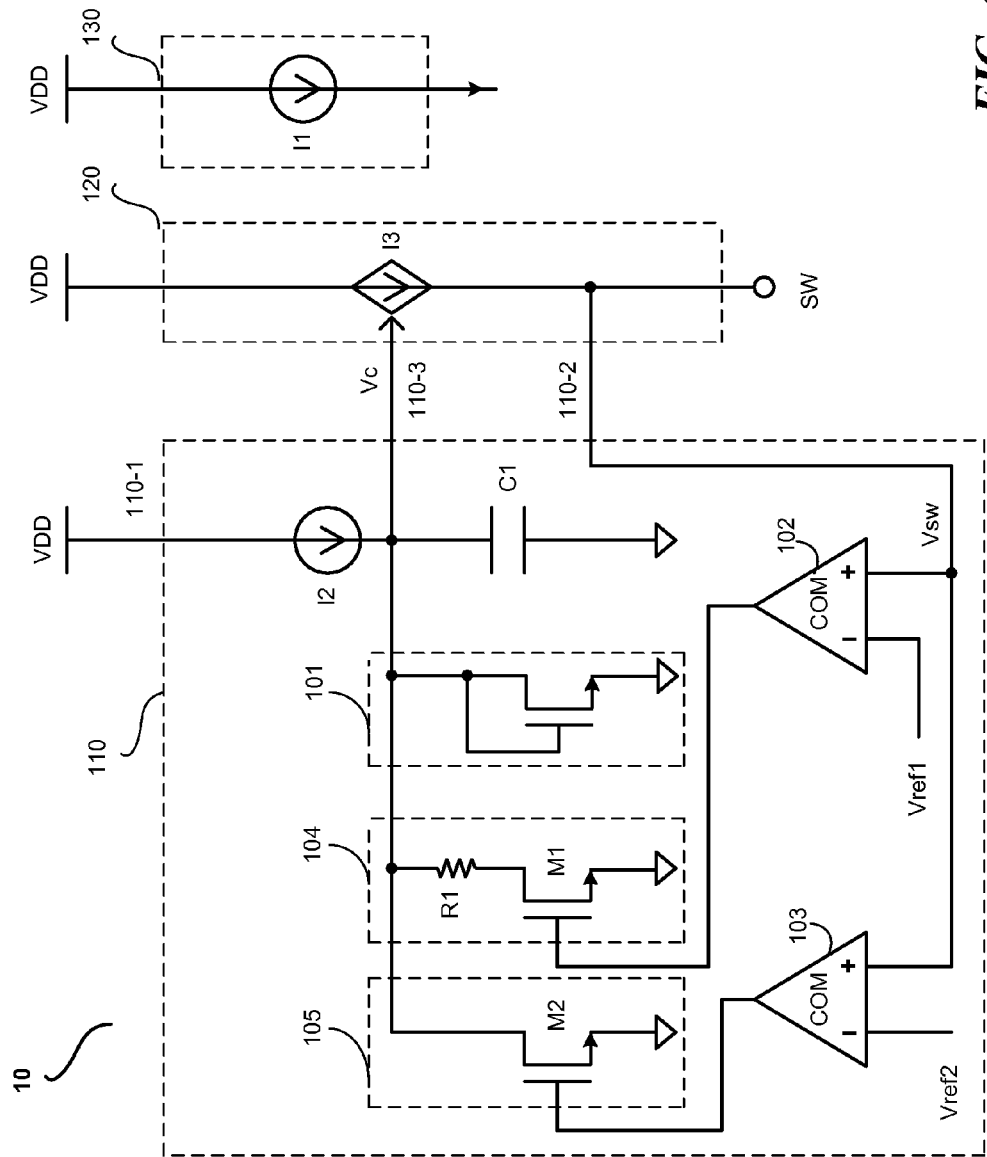
FIG. 4A schematically shows a noise suppression circuit 10 in accordance with an embodiment of the present invention.

FIG. 4A schematically shows a noise suppression circuit 10 in accordance with an embodiment of the present invention.

In one embodiment, the noise suppression circuit 10 is applied in the class D audio amplifier in FIG. 3. As shown in FIG. 4A, the noise suppression circuit 10 comprises: a current source control circuit 110, having a first input terminal 110-1, a second input terminal 110-2 and an output terminal 110-3, wherein the first input terminal 110-1 is coupled to power supply to receive the power supply voltage VDD, the second input terminal 110-2 is coupled to the switching terminal SW of the audio control circuit to receive a switching signal Vsw, and wherein based on the power supply voltage VDD and the switching signal Vsw, the current source control circuit 110 generates a current source control signal Vc at the output terminal 110-3; a controlled current source circuit 120, having a first terminal, a second terminal and a control terminal, wherein the first terminal is configured to receive the power supply voltage VDD, the control terminal is coupled to the output terminal 110-3 of the current source control circuit 110 to receive the current source control signal Vc, and based on the power supply voltage VDD and the current source control signal Vc, the controlled current source circuit 120 provides a current at the second terminal; a first current source 130, having a first terminal and a second terminal, wherein the first terminal is configured to receive the power supply voltage VDD, and the second terminal is coupled to the first input terminal NIN of the audio control circuit, and wherein the second terminal supplies a current to charge the input capacitor Cin.

In one embodiment, the current source control circuit 110 comprises: a second current source I2, having an input terminal and an output terminal, wherein the input terminal is configured to receive the power supply voltage VDD, and the output terminal is configured to provide a current; a capacitor C1, having a first terminal and a second terminal, wherein the first terminal is coupled to the output terminal of the second current source I2 to receive the current, and the second terminal is connected to a ground reference node, and wherein the current source control signal Vc is provided at the first terminal of the capacitor C1.

In one embodiment, the current source control circuit 110 further comprises: a first clamp circuit 101, coupled in parallel with the capacitor C1, wherein when the value of current source control signal Vc reaches a first clamp reference Vclamp, the value of the current source control signal Vc is clamped at the first clamp reference Vclamp by the first clamp circuit 101; a first comparator 102, having a first input terminal (non-inverting input terminal), a second input terminal (inverting input terminal) and an output terminal, wherein the first input terminal is configured to receive the switching signal Vsw, the second input terminal is configured to receive a second reference signal Vref1, and wherein based on the switching signal Vsw and the second reference signal Vref1, the first comparator 102 generates a first discharging control signal at the output terminal; a second comparator 103, having a first input terminal (non-inverting input terminal), a second input terminal (inverting input terminal) and an output terminal, wherein the first input terminal is configured to receive the switching signal Vsw, the second input terminal is configured to receive a third reference signal Vref2, and wherein based on the switching signal Vsw and the third reference signal Vref2, the second comparator 103 generates a second discharging control signal at the output terminal; a first discharging circuit 104, having a first terminal, a second terminal and a control terminal, wherein the first terminal is coupled to the first terminal of the capacitor C1, the second terminal is connected to the ground reference node, and the control terminal is configured to receive the first discharging control signal, and wherein based on the first discharging control signal, the first discharging circuit 104 discharges the capacitor C1; and a second discharging circuit 105, having a first terminal, a second terminal and a control terminal, wherein the first terminal is coupled to the first terminal of the capacitor C1, the second terminal is connected to the ground reference node, and the control terminal is configured to receive the second discharging control signal, and wherein based on the second discharging control signal, the second discharging circuit 105 discharges the capacitor C1.

The first clamp circuit 101 is configured to maintain the value of the current source control signal Vc when the value reaches the first clamp reference Vclamp. Any suitable conventional clamp scheme for clamping the current source control signal Vc may be used without detracting from the merit of the present invention. In one embodiment, the first clamp circuit 101 comprises a N-type MOSFET (Metal Oxide Semiconductor Field Effect Transistor), wherein the N-type MOSFET has a drain terminal coupled to the first terminal of the capacitor C1, a source terminal connected to the ground reference node, and a gate terminal coupled to the drain terminal. In one embodiment, the first clamp circuit 101 comprises a zener diode having a cathode coupled to the first terminal of the capacitor C1 and an anode connected to the ground reference node.

In one embodiment, the first discharging circuit 104 comprises a first switch M1 and a first resistor R1 coupled in series between the capacitor C1 and the ground reference node, wherein the first switch M1 has a control terminal coupled to the output terminal of the first comparator 102 to receive the first discharging control signal.

In one embodiment, the second discharging circuit 105 comprises a second switch M2 having a first terminal, a second terminal and a control terminal, wherein the first terminal is coupled to the first terminal of the capacitor C1, the second terminal is connected to the ground reference node, and the control terminal is coupled to the output terminal of the second comparator 103 to receive the second discharging control signal, and wherein the second switch M2 is controlled by the second discharging control signal.

In one embodiment, the controlled current source circuit 120 comprises a controlled current source I3. Persons of ordinary skill in the art should know that any suitable conventional controlled current source may be used for supplying current without detracting from the merits of the present invention. The relationship between the current provided by the controlled current source I3 and the current source control signal Vc is:

$$I3 = \frac{Vc}{K} \quad (1)$$

wherein K is constant.

Figure 5:
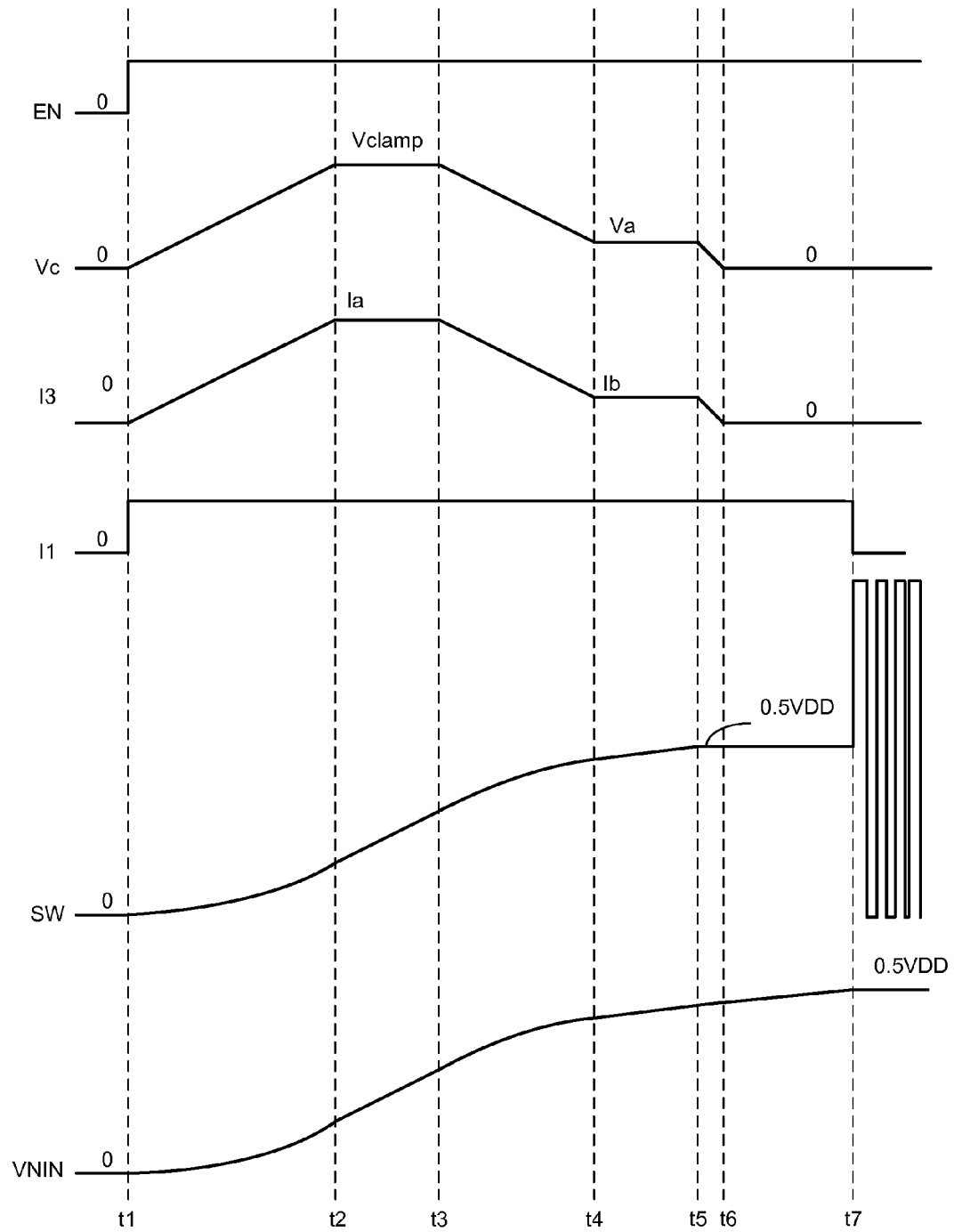
FIG. 5 shows the waveforms of signals in the noise suppression circuit 10 in FIG. 4A.

FIG. 5 shows the waveforms of signals in the noise suppression circuit 10 of FIG. 4A. The operation of the noise suppression circuit 10 is described below with reference to FIGS. 4A and 5.

At time t1, enable signal EN becomes logical high (valid), and the audio control circuit is enabled. Then the second current source I2 charges the capacitor C1 while the charging rate is determined by the current provided by the second current source I2 and the capacitance of the capacitor C1. As a result, the voltage across the capacitor C1, i.e., the current source control signal Vc increases. As can be seen from EQ. (1), the current provided by the controlled current source I3 increases with the same rate. The current source I3 charges the input capacitor Cin and the output capacitor Cout, and the value of the switching signal Vsw increases.

At time t2, the value of the current source control signal Vc reaches the first clamp reference Vclamp and then maintains. The length T of the interval t1-t2 is:

$$T = \frac{Vclamp \times C1}{I2} \quad (2)$$

From time t2, because the value of the current source control signal Vc is clamped to Vclamp, the value of the current provided by the controlled current source I3 is fixed to Ia=Vclamp/K, and the switching signal Vsw increases linearly.

At time t3, the value of the switching signal Vsw reaches the value of the second reference signal Vref1, and the first comparator 102 flips to turn ON the first switch M1. Then the first discharging circuit 104 discharges the capacitor C1, followed by the decrease of the current source control signal Vc. The discharging rate of the capacitor is mainly determined by the time constant R1×C1. As a result, the current provided by the controlled current source I3 decreases, followed by the decrease of the rising speed of the switching signal Vsw.

At time t4, the discharging process of the capacitor C1 ends. But there may still be charges in the capacitor C1 because of the first resistor R1. The value of the current source control signal Vc decreases to a voltage value Va which is the voltage across the resistor R1. As a result, the current provided by the controlled current source I3 is fixed to Ib=Va/K, and the switching signal Vsw increases linearly again. During interval t5-t6, the value of the switching signal Vsw reaches the value of the third reference signal Vref2, and the second comparator 103 flips to turn ON the second switch M2. Then the second discharging circuit 105 discharges the capacitor C1. As a result, the current source control signal Vc and the current of the controlled current source I3 decrease to 0, but the value of the switching signal Vsw maintains. In one embodiment, the value of the third reference signal Vref2 is equal to half of the power supply voltage VDD, i.e., Vref2=0.5 VDD.

During interval t1-t6, the voltage VNIN across the input capacitor Cin follows the switching signal Vsw across the output capacitor Cout, but will be slightly lower than the switching signal Vsw because of the resistor Rf. So the voltage VNIN is less than 0.5 VDD when the switching signal Vsw reaches 0.5 VDD.

The waveform I1 in FIG. 5 represents current provided by the first current source 130 which charges the input capacitor Cin. The current I1 is small and charges the input capacitor Cin once the audio control circuit is enabled. So the input capacitor Cin is charged by two currents, one is provided by the controlled current source I3, and the other is provided by the first current source 130.

At time t7, the voltage VNIN across the input capacitor Cin reaches 0.5 VDD, which means that the pre-charge process is completed. Then the class D audio amplifier starts working.

The first current source 130 starts working when the audio control circuit is enabled, and stops working once the voltage VNIN of the first input terminal NIN of the audio amplifier reaches 0.5 VDD. Any conventional circuit for providing current may be used as the first current source without detracting from the merits of the present invention. For example, the first current source 130 may comprise a constant current source and a switch coupled in series, wherein the switch is turned ON when the audio amplifier is enabled and is turned OFF when the voltage VNIN reaches 0.5 VDD.

Figure 4B:
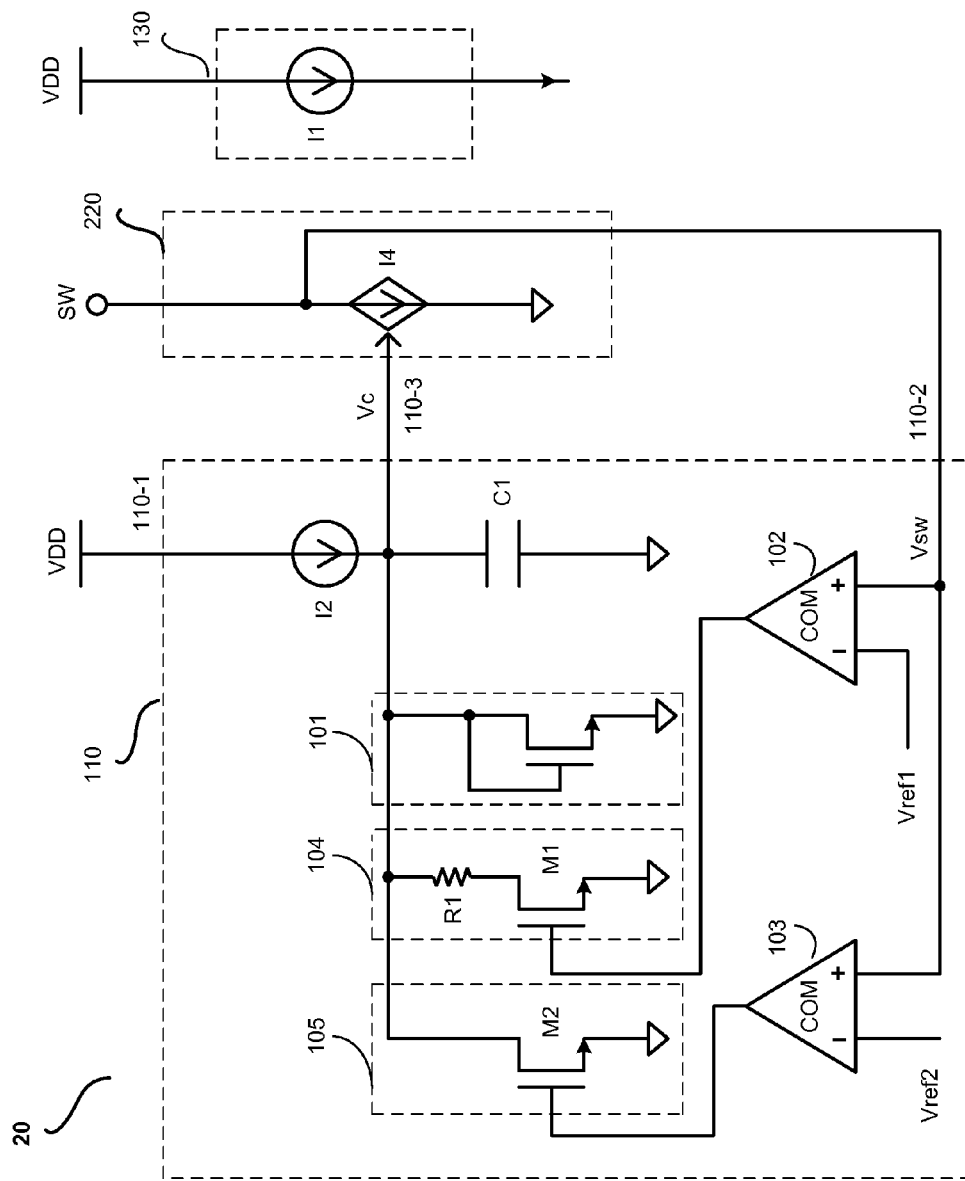
FIG. 4B schematically shows a noise suppression circuit 20 in accordance with an embodiment of the present invention.

FIG. 4B schematically shows a noise suppression circuit 20 in accordance with an embodiment of the present invention. The difference between the noise suppression circuit 20 and the noise suppression circuit 10 is the current direction of the controlled current source circuit. The controlled current source circuit 120 in FIG. 4A provides a current from the power supply to the switching terminal SW while the controlled current source circuit 220 in FIG. 4B provides a current from the switching terminal SW to the ground reference node. In some cases, the voltage across the input capacitor Cin or the voltage across the output capacitor Cout is larger than 0.5 VDD before the system starts. For example, if the system is shut down when both of the input signal and the output signal are very large, and then restarts again immediately, the voltage across the input capacitor Cin and the voltage across the output capacitor Cout may be larger than 0.5 VDD when the system restarts. In that case, the controlled current source 220 in FIG. 4B discharges the input capacitor and the output capacitor to make sure the voltage across these capacitors is 0.5 VDD. The operation of the noise suppression circuit 20 is similar to the operation of the noise suppression circuit 10 and is not described here for brevity.

Figure 6:
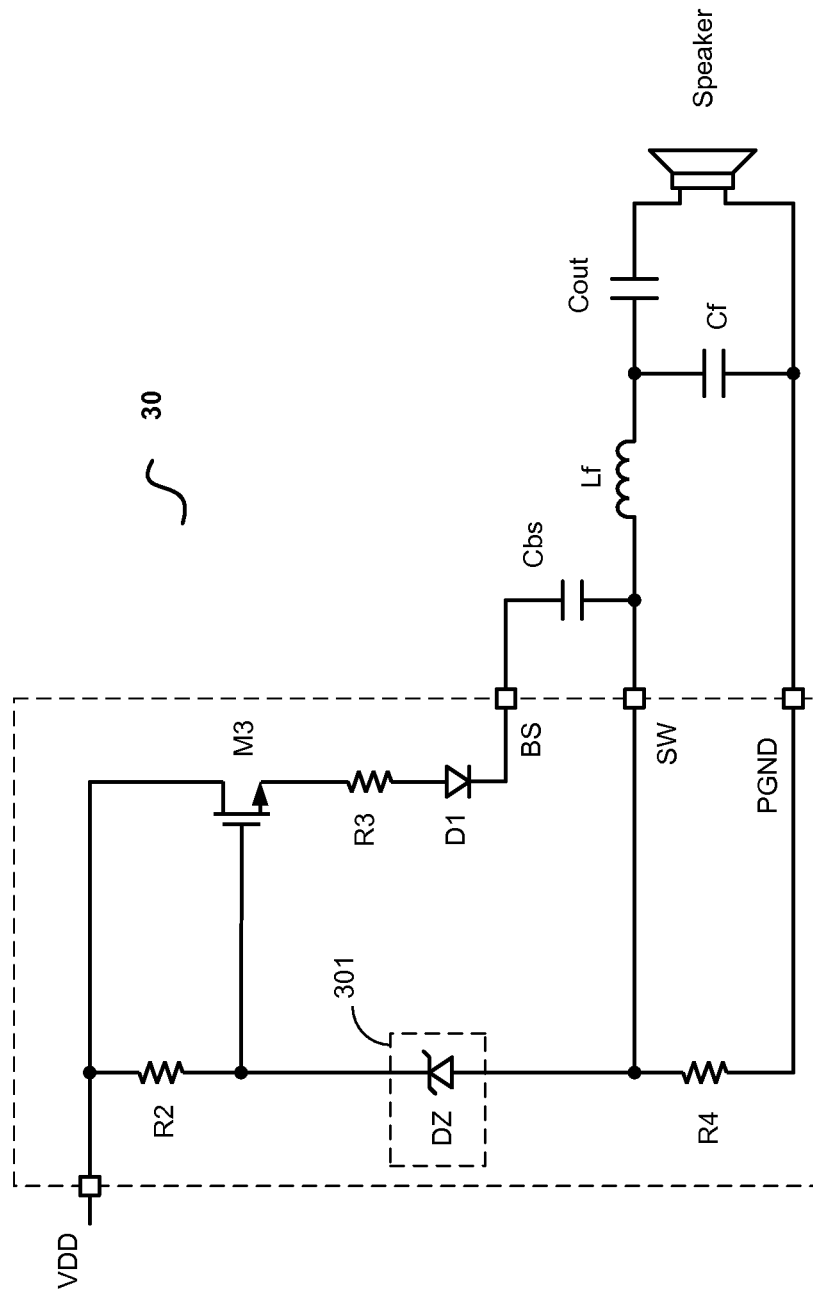
FIG. 6 schematically shows a bootstrap capacitor charging circuit 30 in accordance with an embodiment of the present invention.

Persons of ordinary skill in the art should know that there is a bootstrap capacitor Cbs in some class D audio amplifier. The audio control circuit may have a bootstrap terminal. The bootstrap capacitor Cbs may be coupled between the bootstrap terminal BS and the switching terminal SW. Charging or discharging the bootstrap capacitor Cbs may cause "pop" and "click" noise, too. FIG. 6 schematically shows a bootstrap capacitor charging circuit 30 in accordance with an embodiment of the present invention. The charging circuit 30 only works before the audio control circuit is enabled, so no noise will be caused.

As shown in FIG. 6, the bootstrap capacitor charging circuit 30 comprises a second resistor R2, a third switch M3 and a second clamp circuit 301, wherein: the third switch M3 has a first terminal (drain terminal), a second terminal (source terminal) and a control terminal (gate terminal), and wherein the first terminal is coupled to the power supply to receive the power supply voltage VDD, and the second terminal is coupled to the bootstrap capacitor Cbs; the second resistor R2 is coupled between the power supply and the control terminal of the third switch M3; and the second clamp circuit 301 is coupled between the control terminal of the third switch M3 and the switching terminal SW.

In one embodiment, the third switch M3 comprises an N-type MOSFET. The bootstrap capacitor charging circuit 30 works during when the power supply is plugged but the enable signal is still invalid. When the bootstrap capacitor charging circuit starts, a gate voltage of the third switch M3 is equal to the power supply voltage VDD. So the third switch M3 is turned ON, and the bootstrap capacitor Cbs is charged by the power supply. When the voltage across the third capacitor Cbs increases to the power supply voltage VDD, a gate-source voltage of the third switch M3 is lower than the threshold voltage of the third switch M3, and the third switch M3 is turned OFF. Then the charging process is completed. During the charging process, because the audio control circuit hasn't been enabled, the voltage at the switching terminal is zero. Thus the gate voltage of the third switch M3 will be clamped at the second clamp voltage Vclamp2 by the second clamp circuit 301 once the power supply voltage VDD reaches the second clamp voltage Vclamp2.

In FIG. 6, the second clamp circuit 301 comprises a zener diode. Persons of ordinary skill in the art should know that the second clamp circuit 301 may comprise other devices, such as a MOSFET with the gate and drain terminal connected together.

In one embodiment, the bootstrap capacitor charging circuit 30 further comprises a third resistor R3 and a diode D1 coupled in series between the second terminal of the third switch M3 and the bootstrap capacitor Cbs. The current charging the bootstrap capacitor Cbs could be regulated by changing the resistance of the third resistor R3. The diode D1 is configured to prevent the current flowing back to the power supply.

In one embodiment, the noise suppression circuit in FIG. 3 comprises the noise suppression circuit 10 in FIG. 4A and the bootstrap capacitor charging circuit 30 in FIG. 6. The bootstrap capacitor Cbs is charged by the charging circuit 30 before the audio amplifier is enabled and the input capacitor Cin and the output capacitor Cout are charged by the noise suppression circuit 10 when the audio amplifier is enabled.

In one embodiment, the noise suppression circuit in FIG. 3 comprises the noise suppression circuit 20 in FIG. 4B and the bootstrap capacitor charging circuit 30 in FIG. 6. The bootstrap capacitor Cbs is charged by the charging circuit 30 before the audio amplifier is enabled and the input capacitor Cin and the output capacitor Cout are charged by the noise suppression circuit 20 when the audio amplifier is enabled.

In one embodiment, the noise suppression circuit in FIG. 3 comprises the noise suppression circuit 10, the noise suppression circuit 20 and the bootstrap capacitor charging circuit 30.

Persons of ordinary skill in the art should know that the bootstrap capacitor Cbs may not be included. The charging circuit 30 could be omitted when there is no bootstrap capacitor in the audio amplifier.

Figure 7:
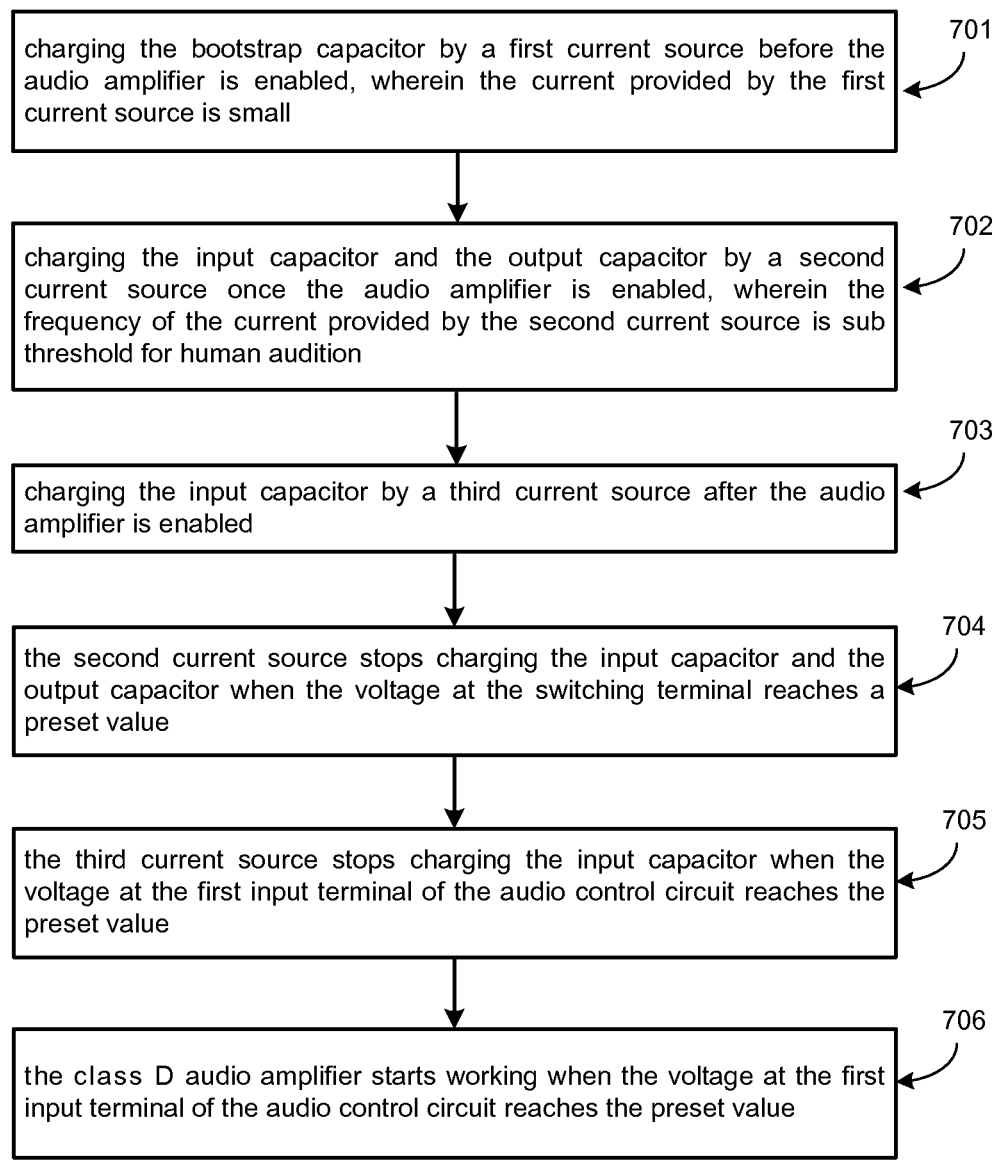
FIG. 7 shows a flow chart 70 of a method of controlling noise suppression in a class D audio amplifier in accordance with an embodiment of the present invention.

FIG. 7 shows a flow chart 70 of a method of noise suppression in accordance with an embodiment of the present invention. The method could be applied in a class D audio amplifier. The class D audio amplifier may comprise an input capacitor, an output capacitor a bootstrap capacitor and an audio control circuit having a first input terminal, a second input terminal and a switching terminal. The method comprises: step 701, charging the bootstrap capacitor by a first current source before the audio amplifier is enabled, wherein the current provided by the first current source is small; step 702, charging the input capacitor and the output capacitor by a second current source once the audio amplifier is enabled, wherein the frequency of the current provided by the second current source is sub threshold for human audition; step 703, charging the input capacitor by a third current source after the audio amplifier is enabled; step 704, the second current source stops charging the input capacitor and the output capacitor when the voltage at the switching terminal reaches a preset value; step 705, the third current source stops charging the input capacitor when the voltage at the first input terminal of the audio control circuit reaches the preset value; and step 706, the audio amplifier starts working when the voltage at the first input terminal of the audio control circuit reaches the preset value.

In one embodiment, the current provided by the second current source is divided to three subinterval, wherein: a first subinterval is defined as during when the voltage at the switching terminal is lower than a first reference; a second subinterval is defined as during when the voltage at the switching terminal is larger than the first reference and is lower than a second reference; and a third subinterval is defined as during when the voltage at the switching terminal is larger than the second reference but is lower than a third reference. The current provided by the second current source rises with a first slope during the first subinterval, maintains during the second subinterval and decreases with a second slope during the third subinterval. The second current source stops working when the voltage at the switching terminal reaches the preset value.

An effective technique for noise suppression in the class D audio amplifier has been disclosed. While specific embodiments of the present invention have been provided, it is to be understood that these embodiments are for illustration purposes and not limiting. Many additional embodiments will be apparent to persons of ordinary skill in the art reading this invention.

We claim:
1. A class D audio amplifier with noise suppression, comprising:
an audio control circuit having a first input terminal configured to receive an input signal, a second input terminal configured to receive a reference signal, and a switching terminal configured to provide a switching signal based on the input signal and the reference signal;
an input capacitor coupled between the input signal and the first input terminal of the audio control circuit;
an inductor having a first terminal and a second terminal, the first terminal coupled to the switching terminal of the audio control circuit;
an output capacitor having a first terminal coupled to the second terminal of the inductor, and a second terminal coupled to a load; and
a noise suppression circuit having a first terminal coupled to the first input terminal of the audio control circuit, and a second terminal coupled to the switching terminal of the audio control circuit, wherein the noise suppression circuit charges the input capacitor and the output capacitor to reach a preset value;
wherein the noise suppression circuit charges the input capacitor and the output capacitor with a current that is initially increasing, then constant, and then decreasing in magnitude.

2. The class D audio amplifier of claim 1, wherein the noise suppression circuit comprises:
a current source control circuit having a first input terminal configured to receive an power supply voltage, a second input terminal coupled to the switching terminal of the audio control circuit to receive the switching signal, and an output terminal configured to provide a current source control signal based on the power supply voltage and the switching signal;
a controlled current source circuit having a first terminal configured to receive the power supply voltage, a control terminal coupled to the output terminal of the current source control circuit to receive the current source control signal, and a second terminal configured to provide a current based on the power supply voltage and the current source control signal; and
a first current source having a first terminal configured to receive the power supply voltage, and a second terminal coupled to the first input terminal of the audio control circuit to supply a current to charge the input capacitor.

3. The class D audio amplifier of claim 2, wherein the current source control circuit comprises:
a second current source having an input terminal configured to receive the power supply voltage, and an output terminal configured to provide a current; and
a capacitor having a first terminal coupled to the output terminal of the second current source to receive the current, and a second terminal connected to a ground reference node;
wherein the current source control signal is provided at the first terminal of the capacitor.

4. The class D audio amplifier of claim 3, wherein the current source control circuit further comprises:
a first clamp circuit coupled in parallel with the capacitor, wherein the value of the current source control signal is clamped at a first clamp reference by the first clamp circuit when the value of current source control signal reaches the first clamp reference;
a first comparator having a first input terminal configured to receive the switching signal, a second input terminal configured to receive a second reference signal, and an output terminal configured to provide a first discharging control signal based on the switching signal and the second reference signal;
a second comparator having a first input terminal configured to receive the switching signal, a second input terminal configured to receive a third reference signal, and an output terminal configured to provide a second discharging control signal based on the switching signal and the third reference signal;
a first discharging circuit having a first terminal coupled to the first terminal of the capacitor, a second terminal coupled to the ground reference node, and a control terminal configured to receive the first discharging control signal, wherein based on the first discharging control signal, the first discharging circuit discharges the capacitor; and
a second discharging circuit, having a first terminal coupled to the first terminal of the capacitor, a second terminal connected to the ground reference node, and a control terminal configured to receive the second discharging control signal, wherein based on the second discharging control signal, the second discharging circuit discharges the capacitor.

5. The class D audio amplifier of claim 4, wherein the first clamp circuit comprises:
a N-type MOSFET (Metal Oxide Semiconductor Field Effect Transistor), having a drain terminal coupled to the first terminal of the capacitor, a source terminal coupled to the ground reference node, and a gate terminal coupled to the drain terminal.

6. The class D audio amplifier of claim 4, wherein the first clamp circuit comprises a zener diode having a cathode coupled to the first terminal of the capacitor, and an anode coupled to the ground reference node.

7. The class D audio amplifier of claim 4, wherein the first discharging circuit comprises a first switch and a first resistor coupled in series between the first terminal of the capacitor and the ground reference node, wherein the first switch has a control terminal coupled to the output terminal of the first comparator to receive the first discharging control signal.

8. The class D audio amplifier of claim 4, wherein the second discharging circuit comprises:
a second switch having a first terminal coupled to the first terminal of the capacitor, a second terminal connected to the ground reference node, and a control terminal coupled to the output terminal of the second comparator to receive the second discharging control signal, and wherein the second switch is turned ON and OFF based on the second discharging control signal.

9. The class D audio amplifier of claim 4, wherein the controlled current source circuit comprises a controlled current source.

10. The class D audio amplifier of claim 1, wherein the class D audio amplifier further comprises a bootstrap capacitor, and the audio control circuit further comprises a bootstrap terminal, and wherein the bootstrap capacitor is coupled between the bootstrap terminal and the switching terminal of the audio control circuit.

11. The class D audio amplifier of claim 10, wherein the noise suppression circuit further comprises a bootstrap capacitor charging circuit, and wherein the bootstrap capacitor charging circuit comprises:
a third switch having a first terminal configured to receive the power supply voltage, a second terminal coupled to the bootstrap terminal of the audio control circuit, and a control terminal;

a second resistor having a first terminal configured to receive the power supply voltage, and a second terminal coupled to the control terminal of the third switch; and a second clamp circuit having a first terminal coupled to the control terminal of the third switch, and a second terminal coupled to the switching terminal of the audio control circuit.

12. The class D audio amplifier of claim 11, wherein the bootstrap capacitor charging circuit further comprises a third resistor and a diode coupled in series between the second terminal of the third switch and the bootstrap terminal.

13. A method of noise suppression in a class D audio amplifier, wherein the class D audio amplifier may comprise an input capacitor, an output capacitor, a bootstrap capacitor and an audio control circuit having a first input terminal, a second input terminal and a switching terminal, the method comprising:

provided current to the bootstrap capacitor by a first current source before the audio amplifier is enabled;

providing current to the input capacitor and the output capacitor by a second current source once the audio amplifier is enabled, wherein the frequency of the current provided by the second current source is sub threshold for human audition;

providing current to the input capacitor by a third current source after the audio amplifier is enabled;

stopping the second current source from providing current to the input capacitor and to the output capacitor when the voltage at the switching terminal reaches a preset value;

stopping the third current source from providing current to the input capacitor when the voltage at the first input terminal of the audio control circuit reaches the preset value; and starting normal operation of the class D audio amplifier when the voltage at the first input terminal of the audio control circuit reaches the preset value.

14. The method of claim 13, wherein the current provided by the second current source is divided to a first subinterval during when the voltage at the switching terminal is lower than a first reference, a second subinterval during when the voltage at the switching terminal is larger than the first reference and is lower than a second reference, and a third subinterval during when the voltage at the switching terminal is larger than the second reference but is lower than a third reference, wherein during the first subinterval, the current provided by the second current source rises with a first slope;

during the second subinterval, the current provided by the second current source is constant;

during the third subinterval, the current provide by the second current source decreases with a second slope; and when the voltage at the switching terminal reaches the preset value, the second current source stops providing current.

* * * * *